United States Patent
Lim et al.

(10) Patent No.: US 8,149,289 B2
(45) Date of Patent: Apr. 3, 2012

(54) PSEUDO-DIGITAL AVERAGE SUB SAMPLING METHOD AND APPARATUS

(75) Inventors: Yong Lim, Suwon-si (KR); Kyoung Min Koh, Hwaseong-si (KR); Soo Youn Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 378 days.

(21) Appl. No.: 12/457,039

(22) Filed: May 29, 2009

(65) Prior Publication Data

US 2009/0309991 A1    Dec. 17, 2009

(30) Foreign Application Priority Data

Jun. 11, 2008   (KR) .................. 10-2008-0054418

(51) Int. Cl.
*H04N 5/228* (2006.01)
(52) U.S. Cl. ................................... 348/222.1
(58) Field of Classification Search ............... 348/222.1
See application file for complete search history.

(56) References Cited

U.S. PATENT DOCUMENTS

| | | | |
|---|---|---|---|
| 5,771,070 A | 6/1998 | Ohzu et al. | |
| 5,877,715 A | 3/1999 | Gowda et al. | |
| 6,067,113 A | 5/2000 | Hurwitz et al. | |
| 6,423,957 B1 | 7/2002 | Kim et al. | |
| 6,677,993 B1 | 1/2004 | Suzuki et al. | |
| 6,727,486 B2 | 4/2004 | Choi | |
| 6,965,407 B2 | 11/2005 | Boemler et al. | |
| 7,256,381 B2 | 8/2007 | Asaba | |
| 7,508,429 B2* | 3/2009 | Lim et al. ................ | 348/241 |
| 7,554,584 B2* | 6/2009 | Lim ........................ | 348/241 |
| 7,609,298 B2* | 10/2009 | Ikeda ..................... | 348/222.1 |
| 7,623,175 B2* | 11/2009 | Lim ........................ | 348/308 |
| 7,724,294 B2* | 5/2010 | Ahn et al. .............. | 348/308 |
| 2005/0174454 A1* | 8/2005 | Ahn et al. .............. | 348/308 |
| 2005/0280730 A1* | 12/2005 | Lim et al. .............. | 348/308 |

\* cited by examiner

*Primary Examiner* — James Hannett

(74) *Attorney, Agent, or Firm* — Lee & Morse, P.C.

(57) ABSTRACT

A method of k*k subsampling, where k is an integer greater than one, a full frame readout on a plurality of pixels arranged in rows and columns, each pixel belonging to one of at least two sets, a first set configured to sense a first value of an image parameter and a second set configured to sense a second value of the image parameter, the method including sampling signals of k pixels of at least one set in a first row to output subsampled signals, converting the subsampled signals into digital signals having a lower resolution than the full frame readout, repeating sampling and converting for k rows, and adding digital signals for the first to kth rows within the at least one set.

21 Claims, 18 Drawing Sheets

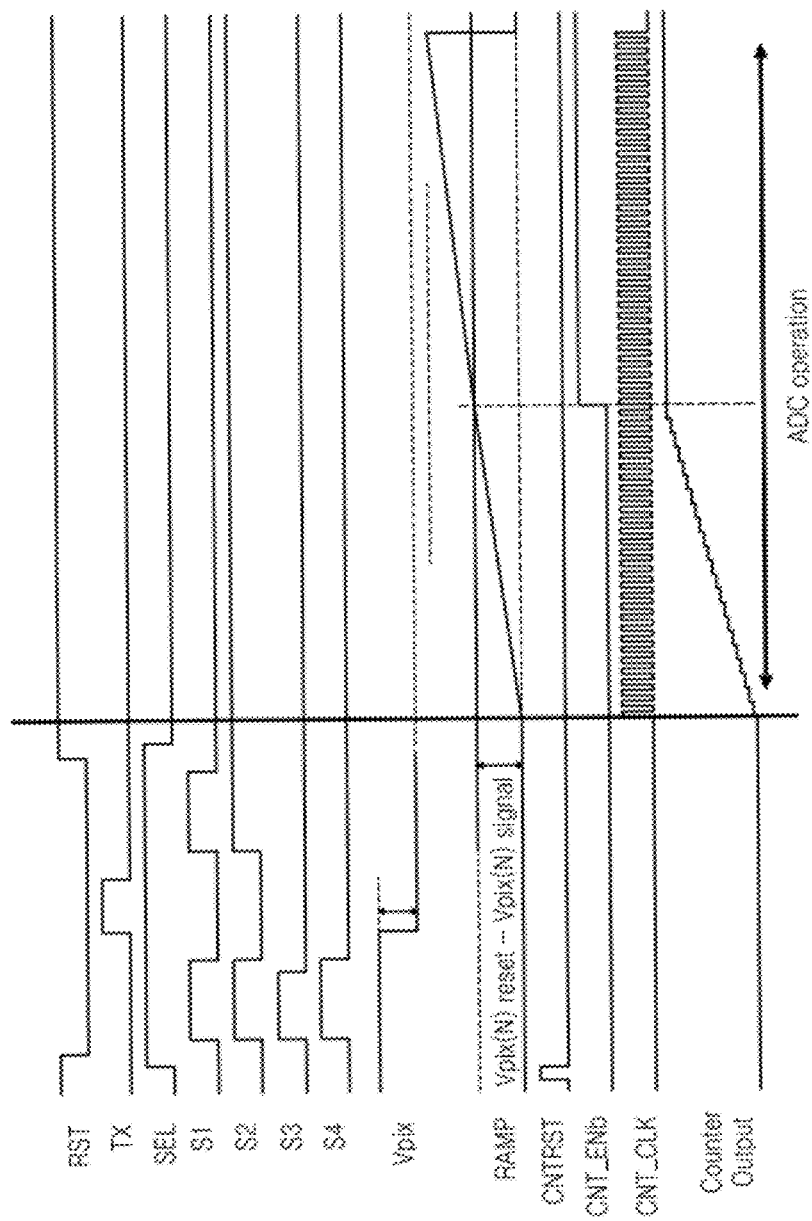

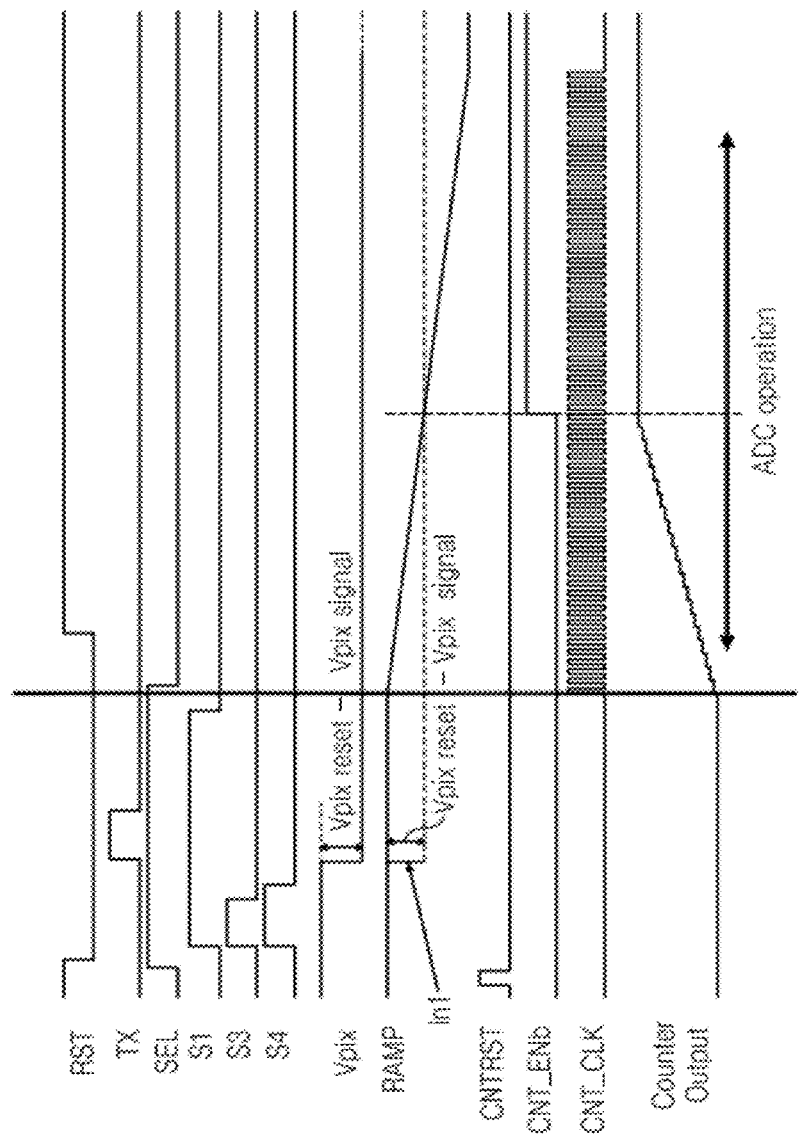

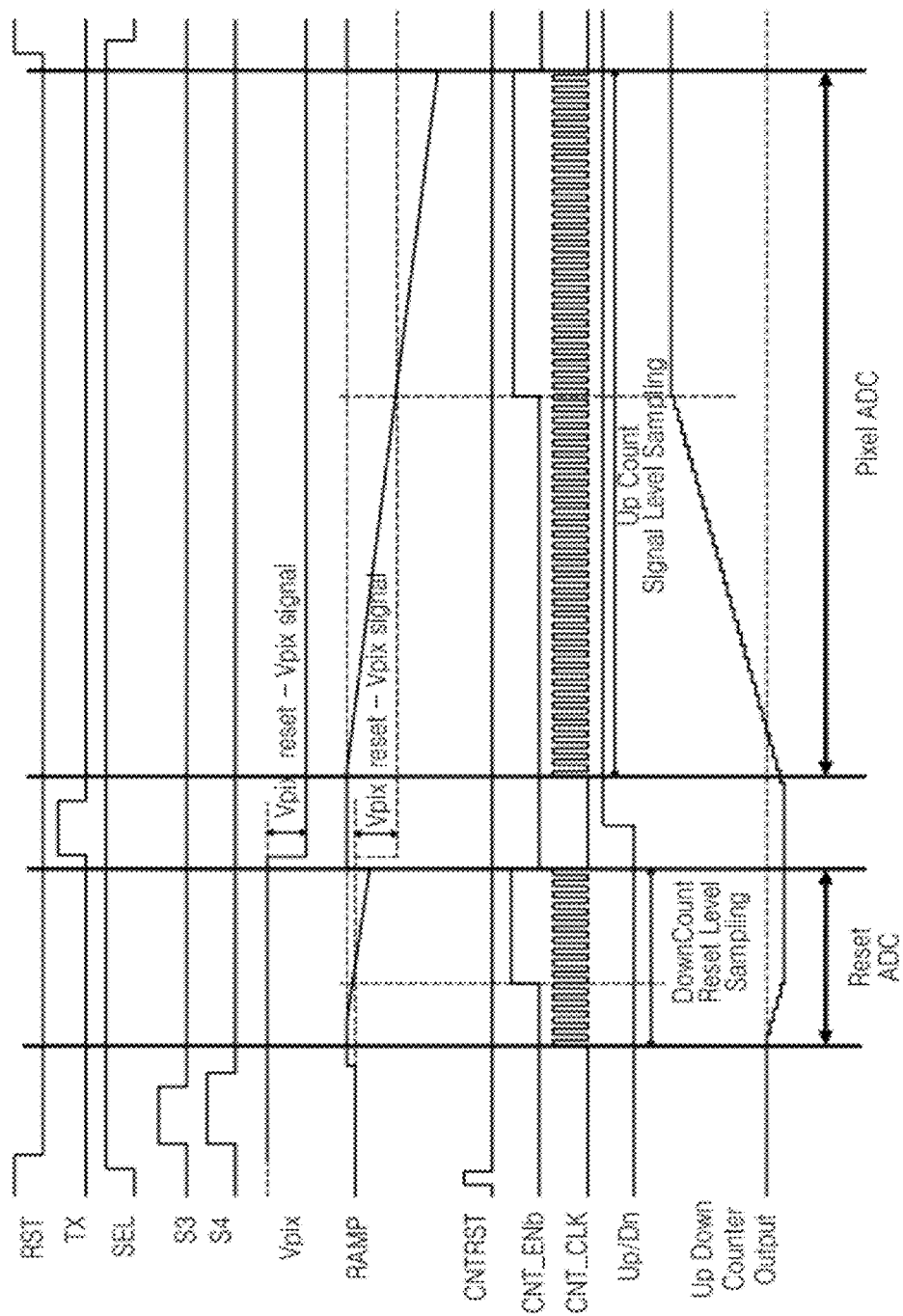

PSEUDO-DIGITAL AVERAGE SUB SAMPLING METHOD AND APPARATUS

BACKGROUND

1. Technical Field

Embodiments are directed to a pseudo-digital average sub sampling method and apparatus.

2. Description of Related Art

When storing an image, numerous techniques are employed to reduce the amount of information required to store an image. Such techniques include subsampling, which may include selection of a single value among a plurality of values in a region or may average the plurality of values within the region. Subsampling using averaged values includes analog vertical averaging, in which quantization occurs after averaging, and digital vertical averaging, in which quantization occurs for each value during averaging, as well as after averaging. In analog vertical averaging, each value in a group, e.g., a row, may be sampled and held, averaged, and then converted to a digital signal. In digital vertical averaging, each value in a group, e.g., a row, may be sampled and held, converted to a digital signal, and then averaged.

Each averaging technique has its own advantages and drawbacks. For example, analog averaging increases routing complexity and possibility of color distortion due to different sampling timings, while digital averaging requires all bits to be read and additional memory for storing quantized data.

SUMMARY

Embodiments are therefore directed to a subsampling method and apparatus, which substantially overcome one or more of the problems due to the limitations and disadvantages of the related art.

It is a feature of an embodiment to provide a subsampling method and apparatus in which subsampling is executed in an analog domain using individual signal quantization without a final total quantization, e.g., [A/2]+[B/2], or, more generally, [A/n]+[B/n] . . . , where n is a number of samples.

It is another feature of an embodiment to provide a subsampling method and apparatus having an increased frame rate relative to the digital averaging, e.g., approximately a same frame rate as analog averaging.

It is yet another feature of an embodiment to provide a subsampling method and apparatus having a simpler layout.

It is still another feature of an embodiment to provide a subsampling method and apparatus having reduced color distortion.

At least one of the above and other features and advantages may be realized by providing a method of k*k subsampling, where k is an integer greater than one, a full frame readout on a plurality of pixels arranged in rows and columns, each pixel belonging to one of at least two sets, a first set configured to sense a first value of an image parameter and a second set configured to sense a second value of the image parameter, the method including sampling signals of k pixels of at least one set in a first row to output subsampled signals, converting the subsampled signals into digital signals having a lower resolution than the full frame readout, repeating sampling and converting for k rows, and adding digital signals for the first to kth rows within the at least one set.

When M is a resolution of the full frame readout, the lower resolution may be $[\log_2(2^M/k)]$;

A slope of a ramp signal used during converting may be k times a slope of a ramp signal used in digital averaging.

The method may include, before converting, reducing noise from sampling. Reducing noise may include correlated double sampling.

The method may include providing a count reset for converting only once during the subsampling.

Sampling, repeating, and adding may be performed for all rows before converting.

Converting may be performed every k rows.

The at least two values may correspond to at least two colors. The at two least colors may be arranged in a matrix pattern.

The at least two sets may include a third set configured to sense a third value of the image parameter, each row including pixels of at least two of the first to third sets. Adjacent rows ay include pixels of the first and second sets and pixels of the first and third sets, repeating includes sampling and converting every other row for first to kth rows.

Each row may include pixels of the at least two sets, wherein sampling and converting for first to kth rows is for each set and adding digital signals for the first to kth rows within each set.

At least one of the above and other features and advantages may be realized by providing an apparatus configured to convert analog pixel signals from a plurality of pixels arranged in rows and columns, each pixel belonging to one of at least two sets, a first set configured to sense a first value of an image parameter and a second set configured to sense a second value of the image parameter, into digital signals, the apparatus including a sampler configured to sample signals of k pixels for at least one set, where k is an integer greater than one, for a first row, an analog to digital converter configured to convert signals output from the first row into a digital signal having a lower resolution than a full frame readout, the sampler and converter configured to sample and convert signals from the first to a kth row, and a summation unit configured to sum digital signals for the first to kth rows within the at least one set.

When M is a resolution of the full frame readout, the lower resolution may be $[\log_2(2^M/k)]$.

A slope of a ramp signal used during converting is k times a slope of a ramp signal used in digital averaging.

The apparatus as may include a noise reducing unit configured to reduce noise from sampling. The noise reducing unit may include a correlated double sampler.

The analog to digital converter comprising a counter configured to be reset only once during the subsampling.

The at least two values may correspond to at least two colors. The at two least colors may be arranged in a matrix pattern.

The at least two sets may include a third set configured to sense a third value of the image parameter, each row including pixels of at least two of the first to third sets. Adjacent rows may include pixels of the first and second sets and pixels of the first and third sets, the sampler and the analog to digital converter being configured to sample and convert every other row for first to kth rows.

Each row may include pixels of the at least two sets, the sampler and the analog to digital converter being configured to sample and convert the first to kth rows is for each set and the summation unit configured to add digital signals for the first to kth rows within each set.

The apparatus may include a mode selector configured to determine whether the apparatus is to operate in a first mode or a second mode, when the apparatus is in the first mode, the analog to digital converter is configured to convert signals output from the first row into a digital signal having a resolution equal to that of a full frame readout and the summation unit is inactive, and, when the apparatus is to operate in the second mode, the analog to digital converter is configured to convert signals output from the first row into a digital signal having a lower resolution than a full frame readout, the sampler and converter configured to sample and convert signals from the first to a kth row, and the summation unit is active.

The apparatus may operate in the first mode when the full frame readout is a still image and in the second mode when the full frame readout is a moving image.

At least one of the above and other features and advantages may be realized by providing an image pick-up device, including a plurality of pixels arranged in rows and columns, each pixel belonging to one of at least two sets, a first set configured to sense a first value of an image parameter and a second set configured to sense a second value of the image parameter, a sampler configured to sample signals of k pixels for at least one set, where k is an integer greater than one, for a first row, an analog to digital converter configured to convert signals output from the first row into a digital signal having a lower resolution than a full frame readout, the sampler and converter configured to sample and convert signals from the first to a kth row, and a summation unit configured to sum digital signals for the first to kth rows within the at least one set.

The image pick-up device may be a CMOS image sensor or a CCD.

At least one of the above and other features and advantages may be realized by providing a system, including a processor, a memory device in communication with the processor, and an image pick-up device in communication with at least one of the processor and the memory device. The image pick-up device may include a plurality of pixels arranged in rows and columns, each pixel belonging to one of at least two sets, a first set configured to sense a first value of an image parameter and a second set configured to sense a second value of the image parameter, a sampler configured to sample signals of k pixels for at least one set, where k is an integer greater than one, for a first row, an analog to digital converter configured to convert signals output from the first row into a digital signal having a lower resolution than a full frame readout, the sampler and converter configured to sample and convert signals from the first to a kth row, and a summation unit configured to sum digital signals for the first to kth rows within the at least one set.

At least one of the above and other features and advantages may be realized by providing a machine-readable medium that provides executable instructions, which, when executed by a processor, cause the processor to perform a method of k*k subsampling, where k is an integer greater than one, a full frame readout on a plurality of pixels arranged in rows and columns, each pixel belonging to one of at least two sets, a first set configured to sense a first value of an image parameter and a second set configured to sense a second value of the image parameter, the method including sampling signals of k pixels of at least one set in a first row to output subsampled signals, converting the subsampled signals into digital signals having a lower resolution than the full frame readout, repeating sampling and converting for k rows, and adding digital signals for the first to kth rows within the at least one set.

BRIEF DESCRIPTION OF THE DRAWINGS

The above and other features and advantages of will become more apparent to those of ordinary skill in the art by describing in detail example embodiments with reference to the attached drawings, in which:

FIG. 3C illustrates a comparative timing diagram for FIG. 3B;

FIG. 4C illustrates a comparative timing diagram for FIG. 4B;

FIG. 5C illustrates a comparative timing diagram for FIG. 5B;

DETAILED DESCRIPTION

Korean Patent Application No. 10-2008-0054418, filed on Jun. 11, 2008, in the Korean Intellectual Property Office, and entitled: "PSEUDO-DIGITAL AVERAGE SUB SAMPLING METHOD AND APPARATUS," is incorporated by reference herein in its entirety.

Embodiments will now be described more fully hereinafter with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

As noted above, current averaging techniques have their own advantages and drawbacks. Generally, analog averaging of two signals A, B may be represented by $[(A+B)/2]$ and digital averaging thereof may be represent by $[([A]+[B])/2]$, where [ ] indicates quantization. In particular, analog averaging increases routing complexity and possibility of color distortion due to different sampling timings, while digital averaging requires all bits to be read and additional memory for storing quantized data.

In contrast, in accordance with embodiments, subsampling may be executed in an analog domain using individual signal quantization without a final total quantization, e.g., $[A/2]+[B/2]$, or, more generally, $[A/n]+[B/n] \ldots$, where n is a number of samples. This may allow one or more of an increased frame rate relative to the digital averaging, e.g., approximately a same frame rate as analog averaging, a simpler layout, and reduction of color distortion.

Figure 1A:
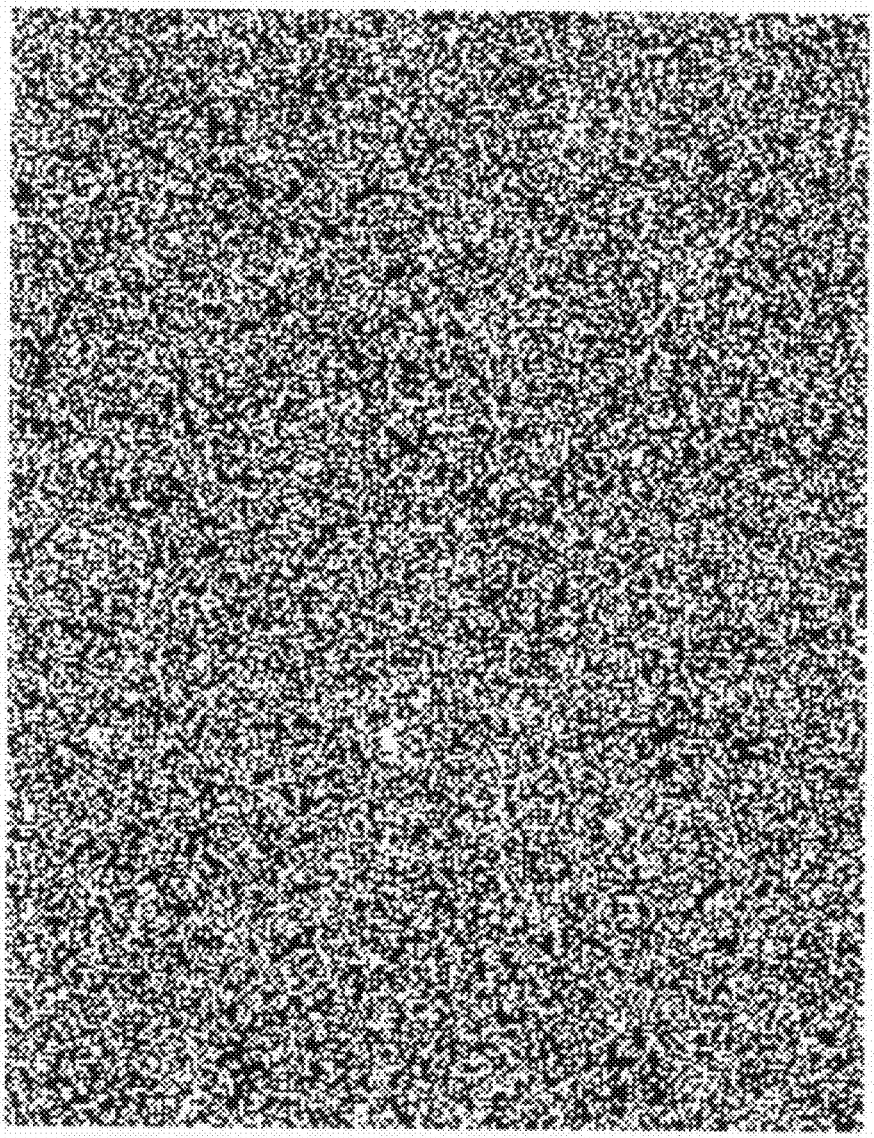
FIG. 1A illustrates differences between averaging in accordance with embodiments and a comparative example.
Figure 1B:
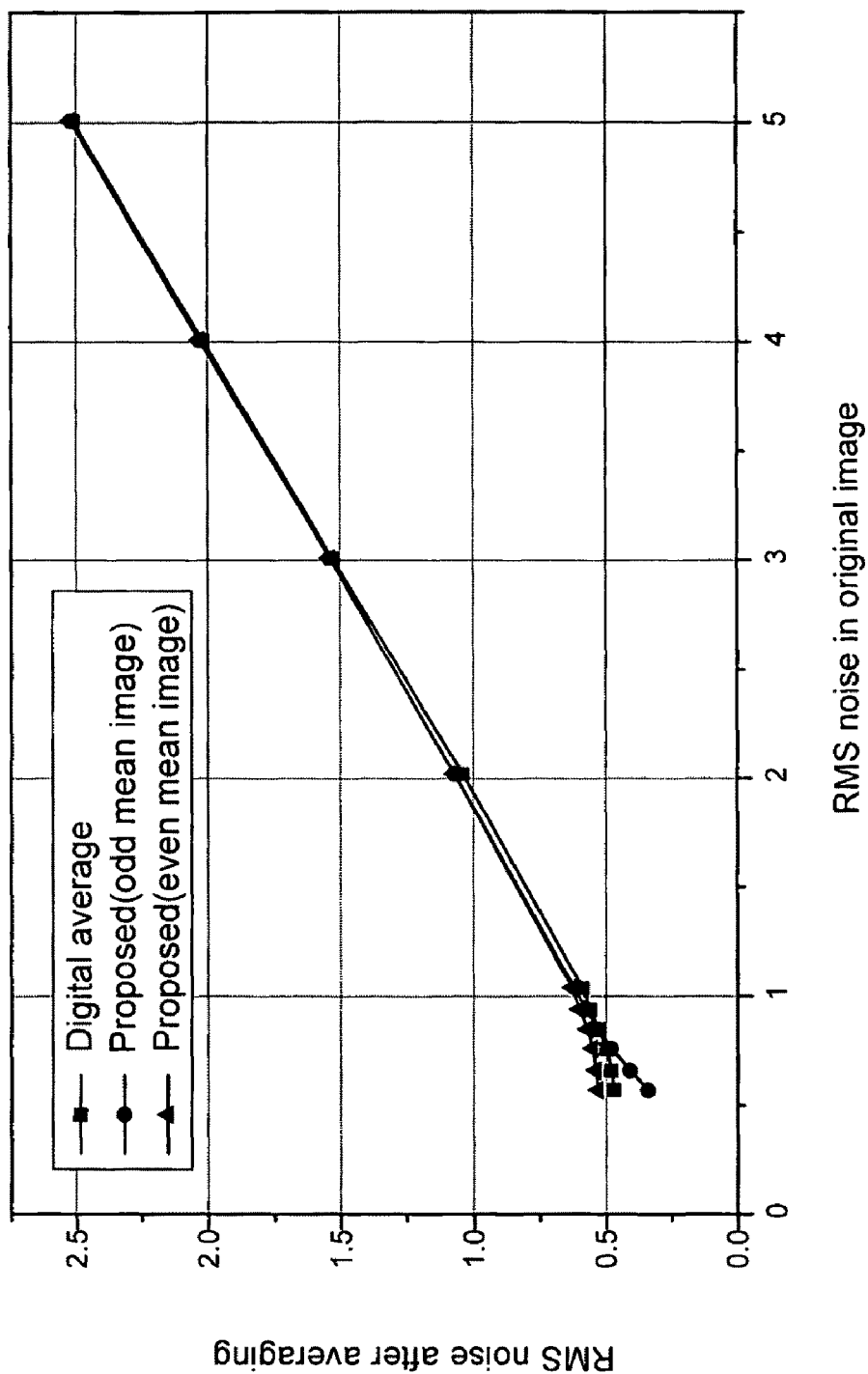
FIG. 1B illustrates a plot of noise reduction in accordance with embodiments and a comparative example.

Such averaging will be referred to herein as "pseudo-digital averaging." Comparison between digital averaging and pseudo-digital averaging is illustrated in FIGS. 1A and 1B.

FIG. 1A illustrates differences between two images, one generated using digital averaging, the other using pseudo-digital averaging. The black regions indicate that the two images have the same value, while the white regions indicate the two images have 1 bit difference. The two images coincide approximately 70% of the time, i.e., differ approximately 30% of the time. However, as can be seen in FIG. 1A, these black and white regions are randomly distributed. Thus, the error in the pseudo-digital averaged image does not depend on the image itself, i.e., is independent of the image. Therefore, differences between the digital averaged image and the pseudo-digital averaged image will not be readily discerned.

FIG. 1B illustrates a plot of the original root mean square (RMS) noise versus the RMS noise after subsampling, where 2*2 subsampling is used on an image having a Gaussian distribution. As may be seen therein, digital averaging and pseudo-digital averaging (odd or even), may provide approximately the same noise reduction.

Figure 2A:
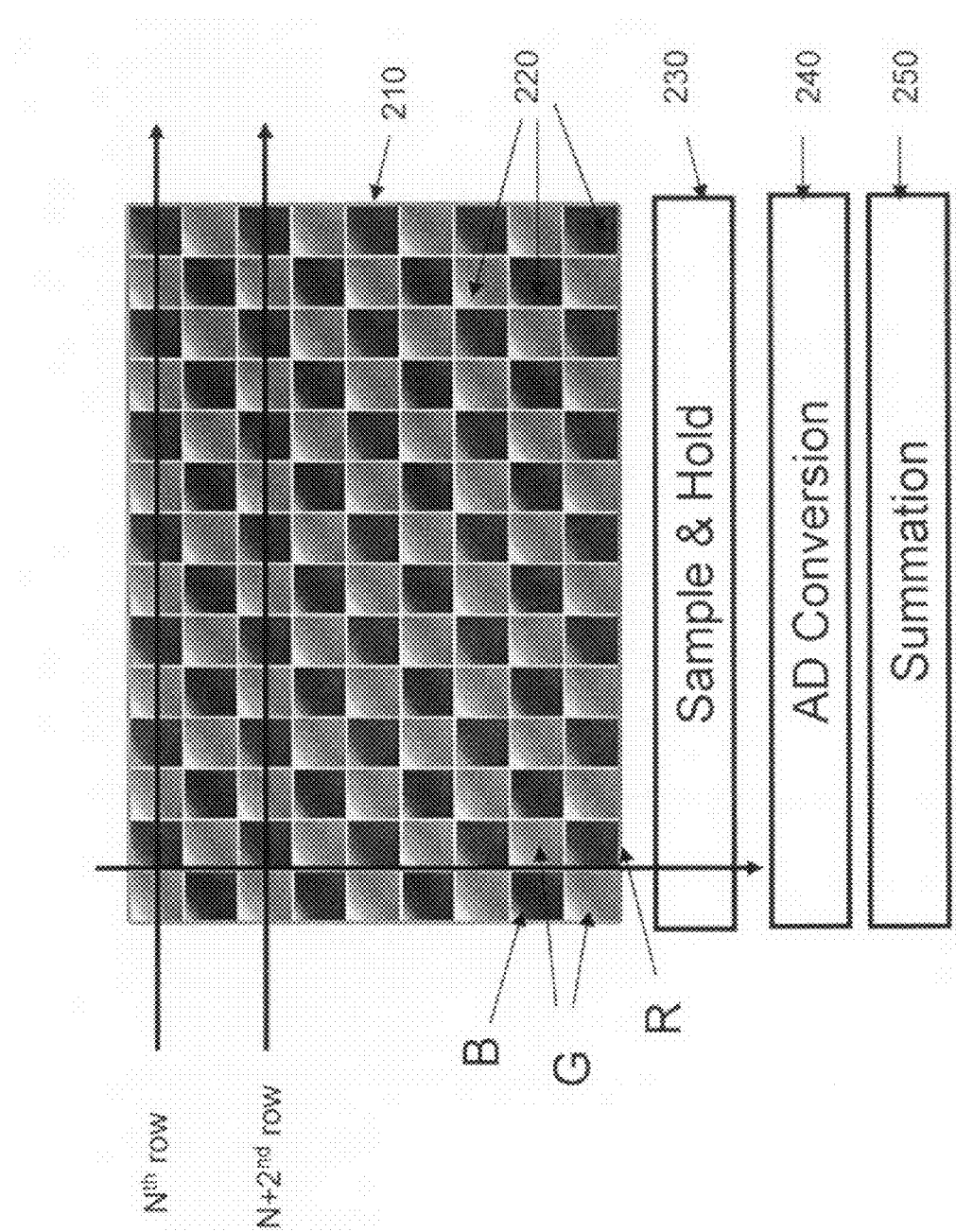
FIG. 2A illustrates row by row subsampling according to an embodiment.

FIG. 2A illustrates an example of row by row subsampling in which 2 values of the same color pixel are subsampled within a pixel array 210. The subsampling structure may include a sample and hold unit 230, an AD conversion unit 240, and a summation unit 250. While the color pixels in FIG. 2A are arranged in a Bayer pattern, any suitable arrangement may be used in accordance with embodiments.

For example, each row may be a single color, each column may be a single color, one row may be a single color followed by another row of two alternating colors, and so forth.

Pixels 220 in the pixel array 210 illustrated in FIG. 2A are arranged in a Bayer pattern, e.g., 1 red (R), 1 blue (B) and 2 green (G) pixels, but embodiments are not limited thereto. When using a Bayer pattern, every other row, i.e., an Nth row and a $N+2^{nd}$ row may be sampled and held by column in the sample and hold unit 230. The output of the sample and hold unit 230 may then be converted into a digital signal by the AD conversion unit 240. The converted data may be added by the summation unit 250 to provide a pseudo-digital averaged output.

In accordance with embodiments, the pseudo-digital averaging may be performed as illustrated in either FIGS. 2B or 2E, as discussed below. For both embodiments, each row may be subject to analog-to-digital conversion (ADC) by the AD conversion unit 240 at a lower resolution than normal imaging, thereby reducing time needed for the conversion. For example, when 2*2 subsampling is used, as illustrated in FIG. 2A, the AD conversion unit 230 may provide 1 bit resolution. This may be expanded to multi-bit resolution, e.g., 3*3 subsampling providing 1.5 bit resolution, 4*4 subsampling providing 2 bit resolution, etc. More generally, when k*k subsampling is used, the A/D conversion has a lower resolution by k/2, i.e., M−k/2, where M is the resolution of the full frame readout. Each bit of A/D conversion is $[\log_2(2^M/k)]$, where [ ] is the greatest integer function. The size of the subsampling may be predetermined, may be set in accordance with image parameters, or may be set by a user.

Further, in both embodiments, the sampling time will be the same, regardless of input signal. If one of the conversions has a different gain or resolution, weighted averaging may be used.

Figure 2B:
FIG. 2B illustrates a timing chart according to an embodiment.

As illustrated in FIGS. 2A and 2B, pseudo-digital averaging in accordance with an embodiment may include the sample and hold unit 230 sampling and holding the Nth row, the AD conversion unit 240 1-bit A/D converting this data, the sample and hold unit 230 sampling and holding the $N+2^{nd}$ row, and then the AD conversion unit 240 1-bit A/D converting this data. Then, the summation unit 250 may add the converted data from the AD conversion unit 240 to provide the pseudo-digital averaged output.

Figure 2C:
FIGS. 2C and 2D illustrate timing charts according to comparative examples.
Figure 2D:
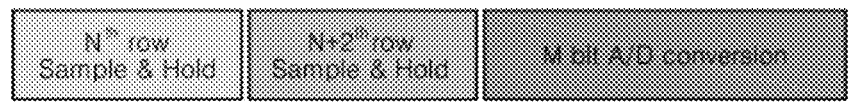

In contrast, as illustrated in FIG. 2C, when digital averaging is used, all rows are sampled and held, and then M-bit ADC is performed thereon. As illustrated in FIG. 2D, when analog averaging is used, k rows are sampled and held, and then M-bit ADC is performed thereon. As may be seen from these comparative examples, pseudo-digital averaging may take about the same time as analog averaging.

Figure 2E:
FIG. 2E illustrates a timing chart according to an embodiment.

As illustrated in FIG. 2E, pseudo-digital averaging in accordance with an embodiment may include correlated double sampling (CDS) when the pixels 220 include, e.g., CMOS image sensors, to enhance the signal to noise ratio. The AD conversion unit 240 may include a single slope or integrating ADC having a ramping signal with a slope multiplied in accordance with the subsampling size, e.g., as compared with digital averaging, the ramping slope for 2*2 subsampling will be doubled, the ramping slope for 4*4 subsampling will be quadrupled, etc. The sample and hold unit 230 may thus sample and hold the Nth row, during the sampling and holding, the AD conversion unit 240 may perform CDS, and then (M−1)-bit A/D convert this data using a ramping signal. Then, the sample and hold unit 230 may sample and hold the $N+2^{nd}$ row during the sampling and holding. Then, the AD conversion unit 240 may (M−1)-bit A/D convert this data using a ramping signal. Then, the summation unit 250 may add the converted data from the AD conversion unit 240 to provide the pseudo-digital averaged output.

Figure 2F:
FIG. 2F illustrates a timing chart according to a comparative example.

In contrast, as illustrated in FIG. 2F, when digital averaging is used, all rows are sampled and held, and CDS applied, and then ramping and M-bit ADC is performed thereon. As discussed in detail later, ramping in the pseudo-digital averaging including CDS illustrated in FIG. 2E will have a ramping slope that is k times a ramping slope of the ramping in the digital averaging including CDS.

Figure 3A:
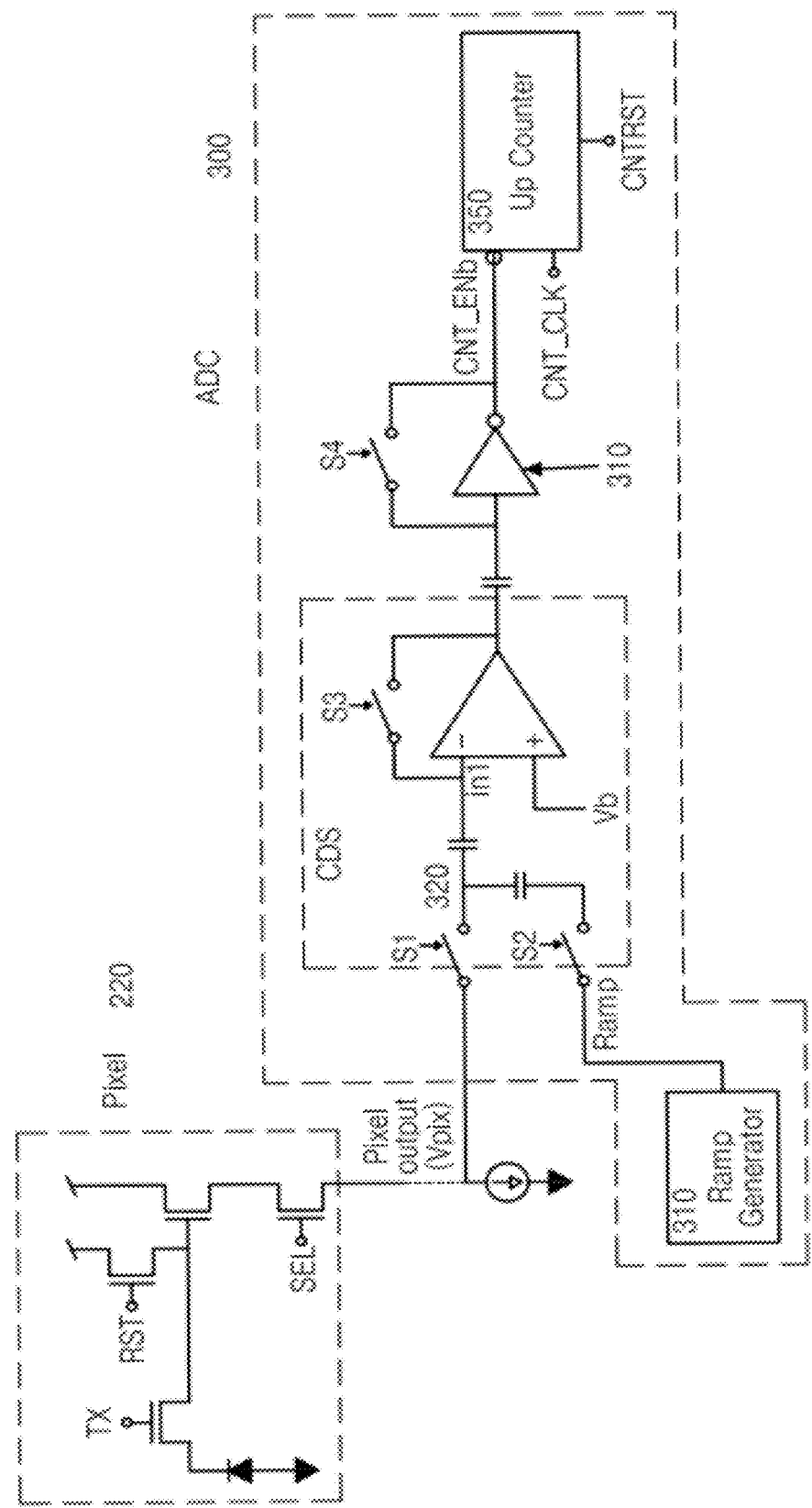
FIGS. 3A and 3B illustrate a circuit diagram and a timing diagram, respectively, according to a first embodiment.
Figure 3B:
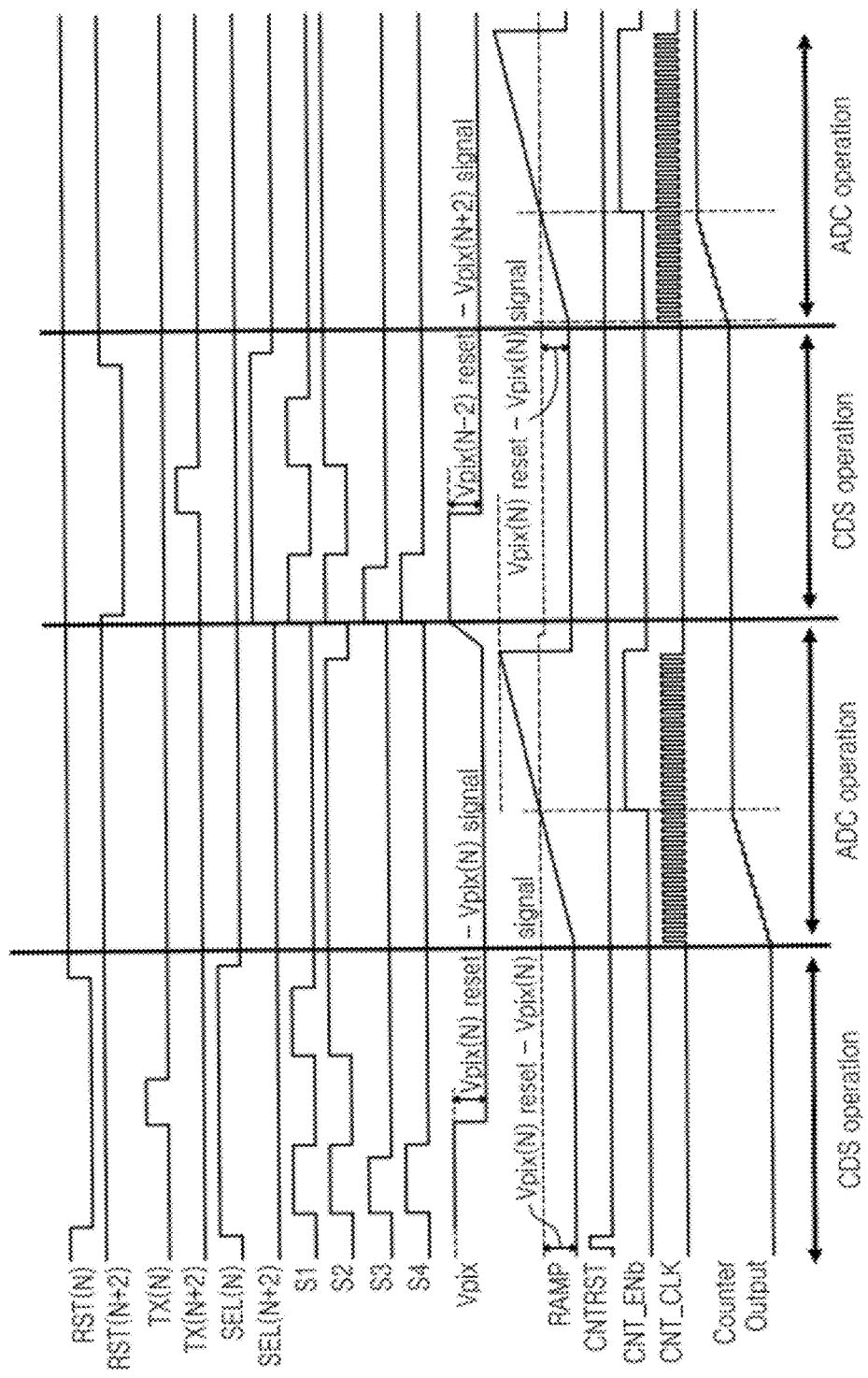
Figure 4A:
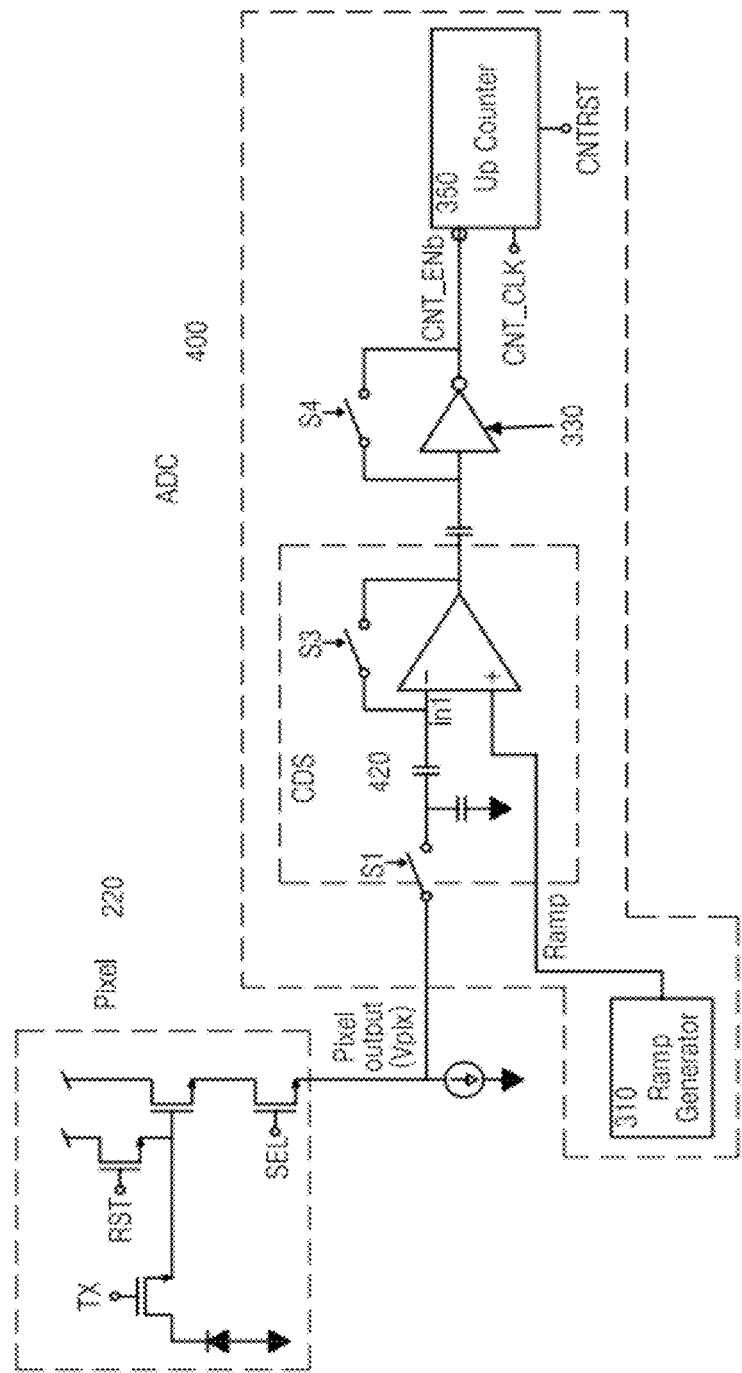
FIGS. 4A and 4B illustrate a circuit diagram and a timing diagram, respectively, according to a second embodiment.
Figure 4B:
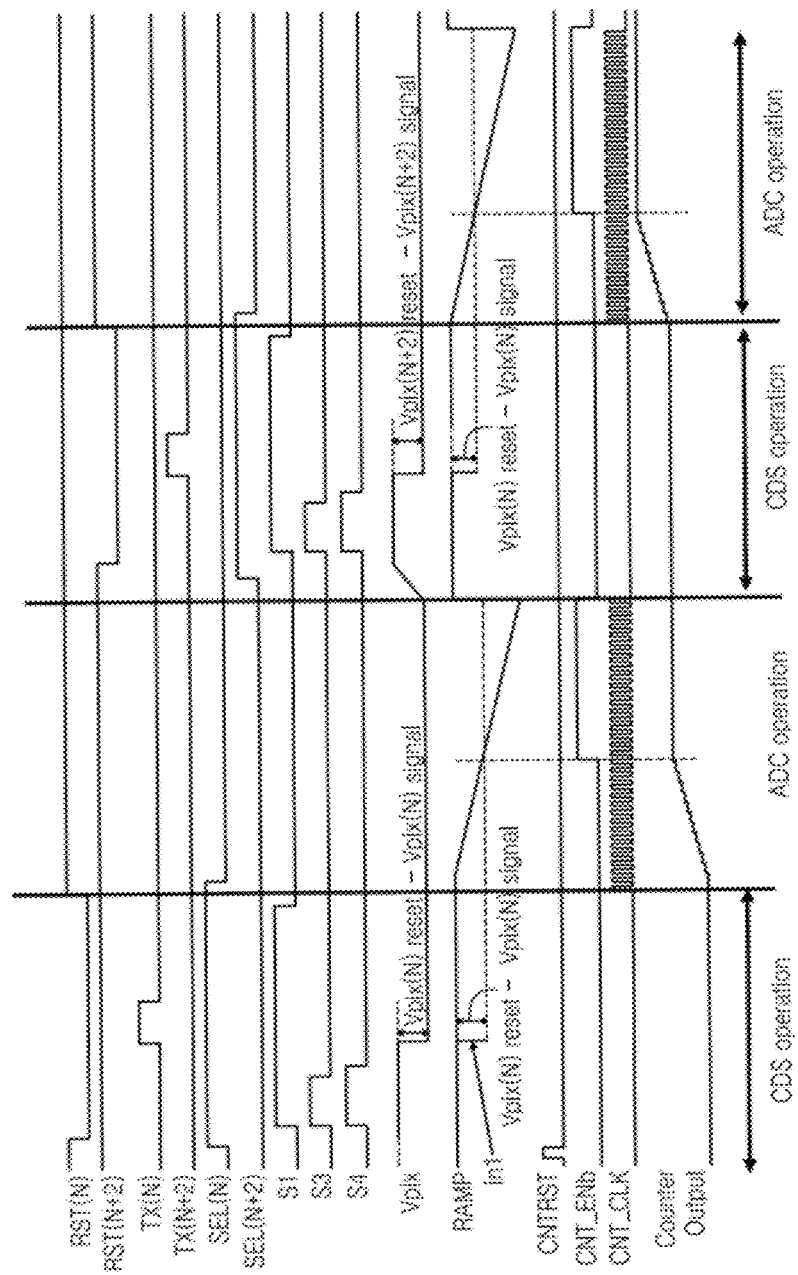
Figure 5A:
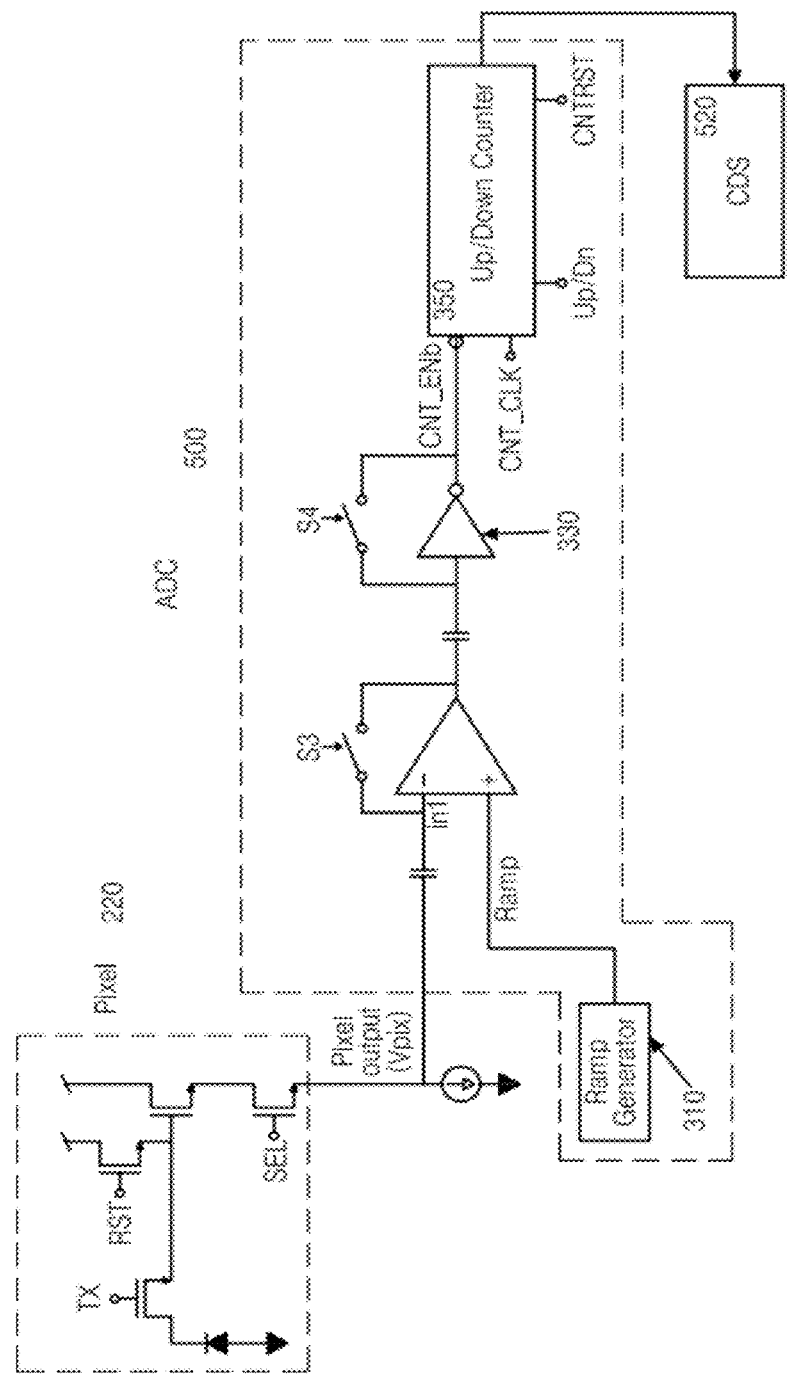
FIGS. 5A and 5B illustrate a circuit diagram and a timing diagram, respectively, according to a third embodiment.
Figure 5B:
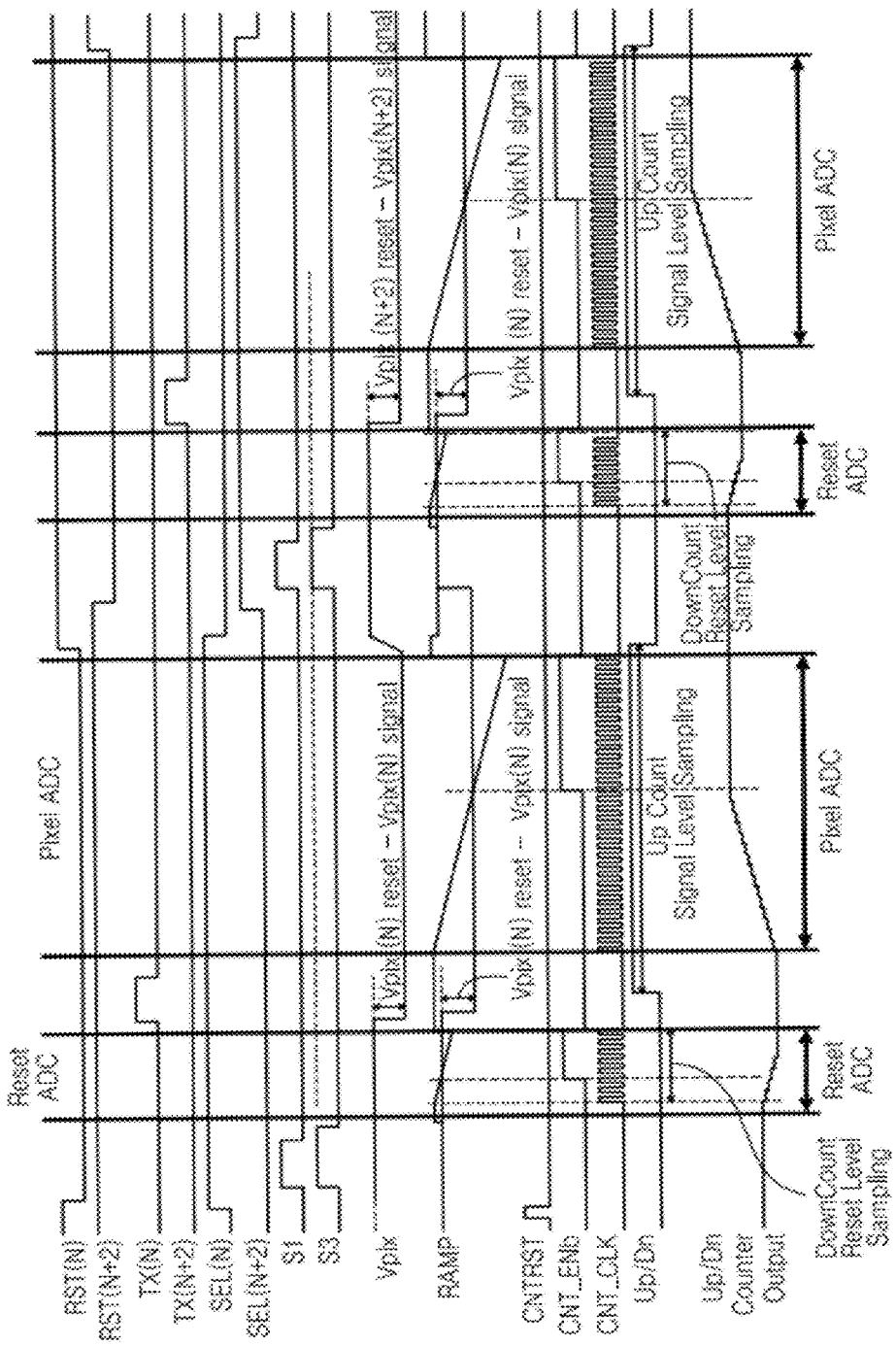

Different configurations for the AD conversion unit 240 according to embodiments are illustrated in FIGS. 3A to 5C. In particular, FIGS. 3A, 4A, 5A illustrate circuit diagrams according to embodiments, FIGS. 3B, 4B, 5B illustrate timing diagrams for operation of pseudo-digital averaging according to embodiments, and FIGS. 3C, 4C, 5C illustrate timing diagrams for operation of digital averaging.

In all of these embodiments, an AD conversion unit 300, 400, 500 may be connected to each pixel 220 of the pixel array 210. Each pixel 220 may be a four-transistor CIS pixel. Each pixel 220 may include a photodiode generating an image voltage, a transfer transistor Tx, a reset transistor RST, a drive transistor, a select transistor SEL, and a bias current source. The select transistor SEL may output the voltage from the drive transistor as a pixel output voltage Vpix.

Generally, when CDS is used to read the pixel data, CDS subtracts the pixel reset voltage Vpix(N) reset from the pixel signal voltage Vpix(N) signal. During reading of the pixel reset voltage Vpix(N) reset, the transfer transistor Tx may be turned on, the reset transistor RST may be turned on long enough to charge the floating node connected to the drive transistor to a reset voltage, and the select transistor SEL may be turned on to output the pixel reset voltage Vpix(N) reset. During reading of the pixel signal voltage Vpix(N) signal, the transfer transistor Tx may be turned on long enough to charge the floating node connected to the drive transistor to the data voltage, the reset transistor RST may be turned off, and the select transistor SEL maybe turned on to output the pixel image voltage Vpix(N) image.

As illustrated in FIG. 3A, the ADC 300 may be electrically connected to each pixel 220 in each column. The ADC 300 may include a ramp generator 310, a CDS circuit 320, an amplifier 330 connected in series with a fourth switch S4 and an up counter 350. While the ramp generator 310 and the CDS 320 are illustrated as part of the ADC 300, they may be separate therefrom. The CDS 320 may include a first switch S1, a second switch S2, a comparator, and a third switch S3.

As illustrated in FIGS. 3A and 3B, the CDS 320 may receive the pixel output Vpix via the first switch S1 connected in series and a ramp signal Ramp from the ramp generator 310 via the second switch S2 connected in series. A CDS value in1 varies according to the ramp signal Ramp. The comparator may be connected in parallel with the third switch. The comparator may compare the CDS value in1 with a reference voltage Vb. The up counter 350 may count the input data in accordance with a count clock signal CNT_CLK until the CDS value in1 exceeds the reference voltage Vb, at which time a count enable signal CNT_ENb is switched. An output of the up counter 350 is the digitized CDS value. The up counter 350 may also receive a count reset after the conversion is finished to reset the up counter 350.

By comparing FIGS. 3B and 3C, when 2*2 subsampling is used, the slope of the ramp signal may be twice that of the conventional ramp signal Ramp.

As illustrated in FIG. 4A, the ADC 400 may be electrically connected to each pixel 220 in each column. The ADC 400 may include the ramp generator 310, a CDS circuit 420, the amplifier 330 connected in series with the fourth switch S4, and the up counter 350. While the ramp generator 310 and the CDS 420 are illustrated as part of the ADC 400, they may be separate therefrom. The CDS 420 may include the first switch S1 in series with the input of the pixel output, the comparator, and the third switch S3 connected in parallel with the comparator.

In contrast with the CDS 320 illustrated in FIG. 3A, the comparator in the CDS 420 compares the pixel output to the ramp signal Ramp. By comparing FIGS. 4B and 4C, when 2*2 subsampling is used, the slope of the ramp signal may be twice that of the conventional ramp signal.

As illustrated in FIG. 5A, an ADC 500 may be electrically connected to each pixel 220 in each column. The ADC 500 may include the ramp generator 310, the comparator connected in parallel with the third switch S3, the amplifier 330 connected in series with the fourth switch S4, and the up counter 350. While the ramp generator 310 is illustrated as part of the ADC 400, it may be separate therefrom. A CDS 520 may be separate from the ADC 500 and may be a digital CDS, i.e., may subtract the reset from the pixel signal after each of these values has been digitized. The reset may eliminate ADC variation.

In contrast with the CDS 420 illustrated in FIG. 4A, the comparator in the CDS 520 resets the ramp signal before comparing the pixel output to the ramp signal Ramp. By comparing FIGS. 5B and 5C, when 2*2 subsampling is used, the slope of the ramp signal during both the reset and the ADC may be higher that of the conventional ramp signal.

Figure 6:
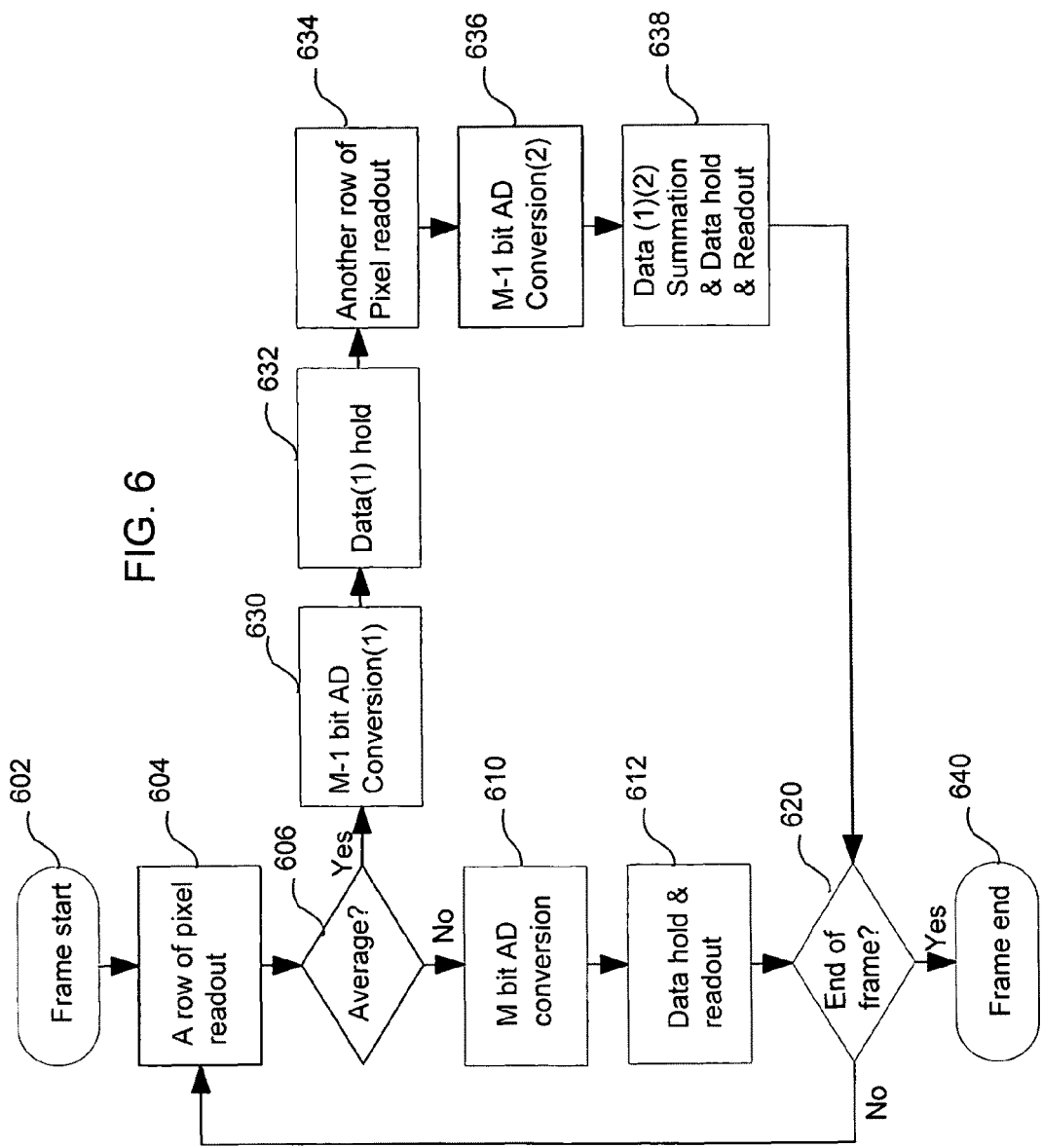
FIG. 6 illustrates a flowchart of normal and subsampling methods according to embodiments.

FIG. 6 illustrates a general flowchart of the pseudo-digital averaging according to any of the above embodiments as may be employed in an actual imaging device. A user may select between modes, e.g., still or moving images, and may select using averaging or no averaging. Typically in a moving image mode, averaging may be used.

As illustrated in FIG. 6, an imaging method may begin when a frame is started in operation 602. In operation 604, a pixel row may be read out. Operation 606 determines whether averaging is to be employed or not.

If averaging is not to be employed, the method may proceed to operation 610, in which M bit AD conversion is performed. In operation 612, data may be held and read out. Operation 620 determines whether an end of the frame has been reached. If not, the method may return to operation 604. If the end of the frame has been reached, the method may end in operation 640.

If averaging using 2×2 subsampling in accordance with embodiments is to be employed, as determined in operation 606, the method may proceed to operation 630 in which M−1 bit conversion may be performed on a first row, e.g., the Nth row. Then, the converted data may be held in operation 632. Operation 634 may read another row, e.g., the $N+2^{nd}$ row. Operation 636 may perform M−1 bit conversion on the another row. The converted data from these M−1 bit conversions may be added, held, and read out in operation 638. Then, the method may proceed to operation 620 to determine whether the end of the frame has been reached. If not, the method may return to operation 604. If the end of the frame has been reached, the method may end in operation 640.

Figure 7A:
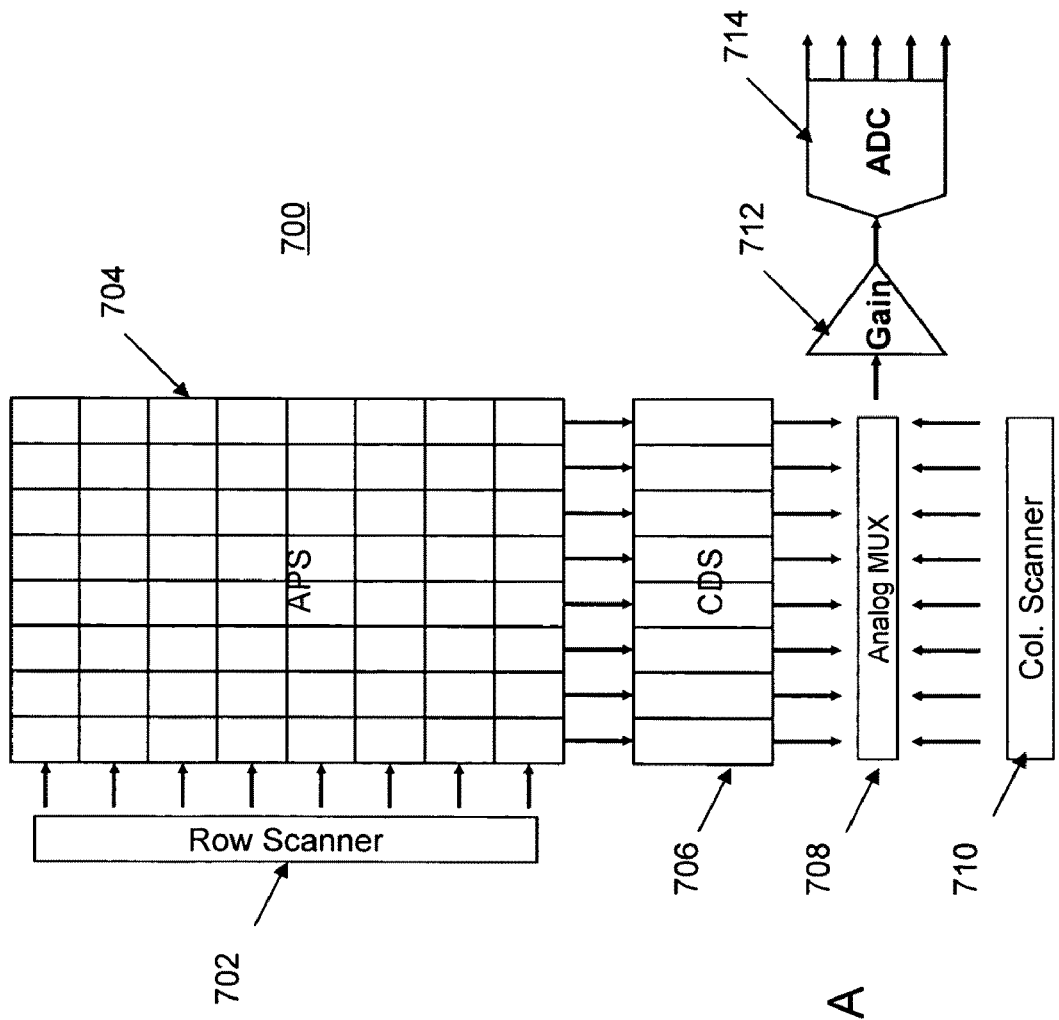
FIG. 7A illustrates an image apparatus using a single ADC according to embodiments.

FIGS. 7A illustrates a block diagram of an imaging system 700 according to an embodiment in which a single ADC is employed. The imaging system 700 may include a row scanner 702, a pixel array 704, here illustrated as an active pixel sensor (APS), e.g., a CMOS sensor, a CDS unit 706, an analog multiplexer 708, a column scanner 710, a gain controller 712, and an ADC 714.

The APS 704 outputs signals by column to the CDS unit 706, which in turn may output signals to the analog multiplexer 708. The multiplexed signals may then be output to the gain controller 712. The amplified multiplexed signals are then output to the single ADC 714, where they are converted into a digital signal and output the pseudo-digital averaged signals.

Figure 7B:
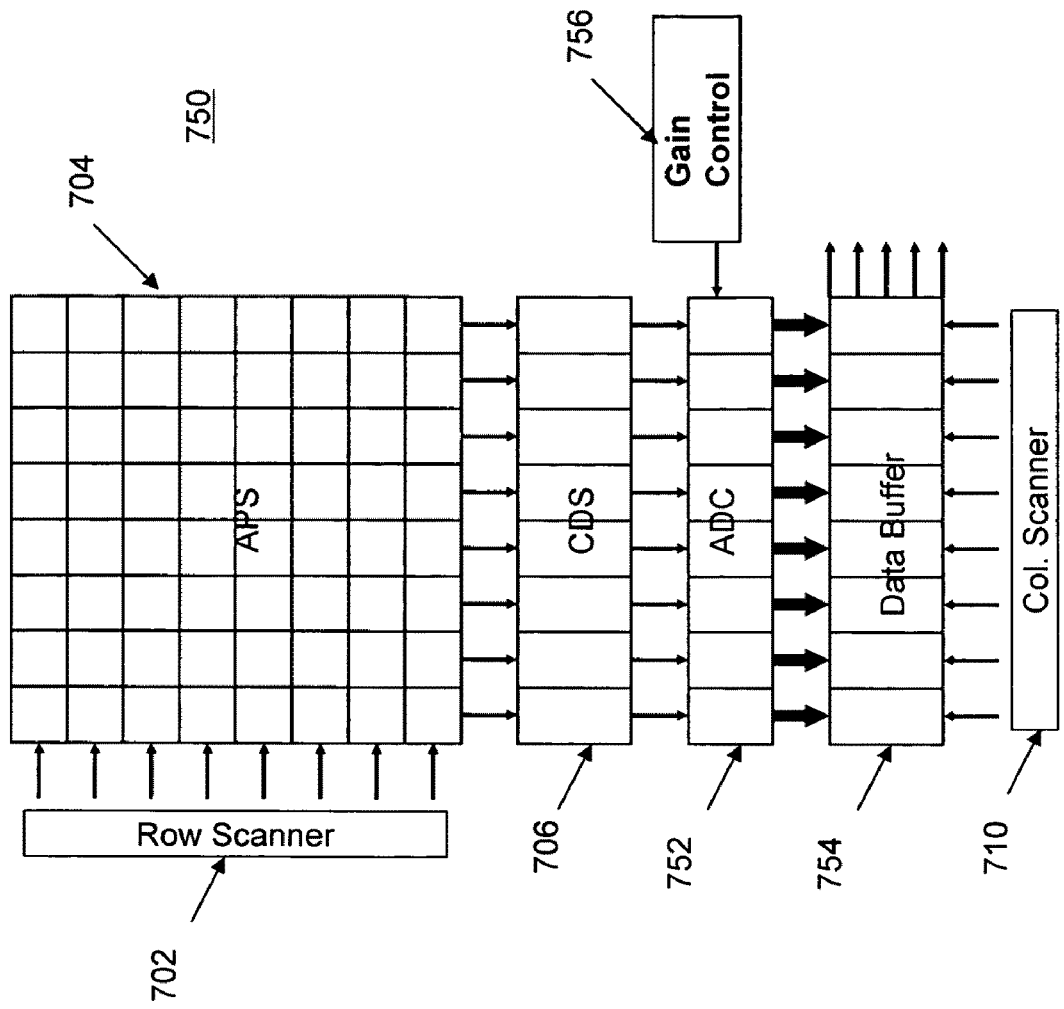
FIG. 7B illustrates an image apparatus using a column parallel ADC according to embodiments.

FIGS. 7B illustrates a block diagram of an imaging system 750 according to an embodiment in which column parallel ADC is employed. The imaging system 750 may include the row scanner 702, the pixel array 704, here illustrated as an active pixel sensor (APS), e.g., a CMOS sensor, the CDS unit 706, a column parallel ADC 752, a data buffer 754, the column scanner 710, and a gain controller 756.

The APS 704 may output signals by column to the CDS unit 706, which in turn outputs signals to the ADC 752, which is controlled by the gain controller 756. The digital signals are then output to the data buffer 754, which are then output. The amplified multiplexed signal is then output to the single ADC 714, where it is converted into a digital signal and output as the pseudo-digital averaged signals.

Figure 8:
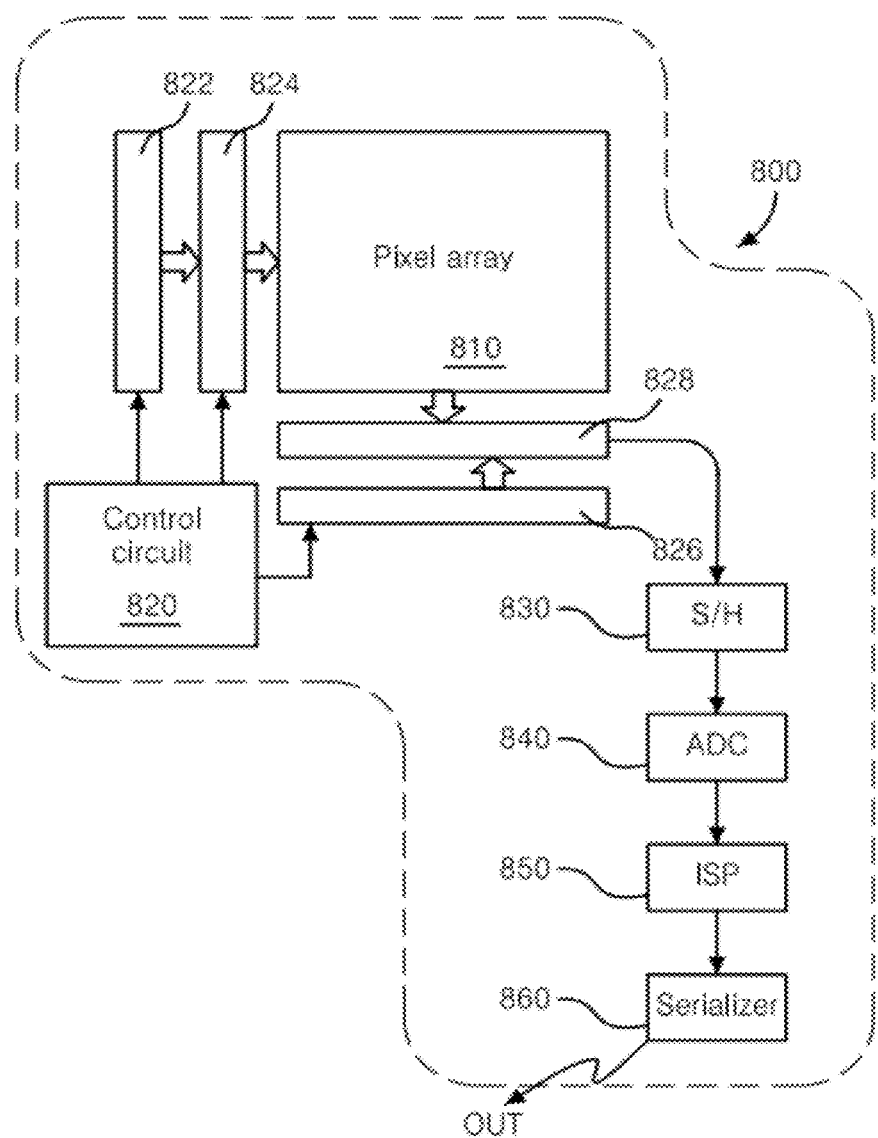
FIG. 8 illustrates a block diagram of an image pick-up in accordance with an embodiment.

FIG. 8 illustrates a block diagram of an image pick-up apparatus 800 according to an embodiment. The image pick-up apparatus 800 may include a pixel array 810, a control circuit 820, a sample and hold (S/H) unit 830, an analog-to-digital converter (ADC) 840, an image signal processor (ISP) 850 and a serializer 860.

The pixel array 810 may include a plurality of pixels arranged in a predetermined number of columns and rows. Pixels in each row may be turned on simultaneously, while pixels in each column may be selectively turned on.

The control circuit 820 may control an address decoder 822 and a column decoder 824 to select appropriate row and column lines for pixel readout. In response, a row driver 826 and a column driver/output 828 may apply driving voltages to drive transistors of selected row and column lines. Image data may then be output from the pixel array 810 from the selected column through the column driver/output 828 to the S/H unit 830. In turn, the S/H unit 830 may output the image data to the ADC 840.

The ISP 850 may receive digital image data from the ADC 840, in which the image synthesizing according to embodiments may be performed. This synthesized image data may then be output to the serializer 860.

Figure 9:
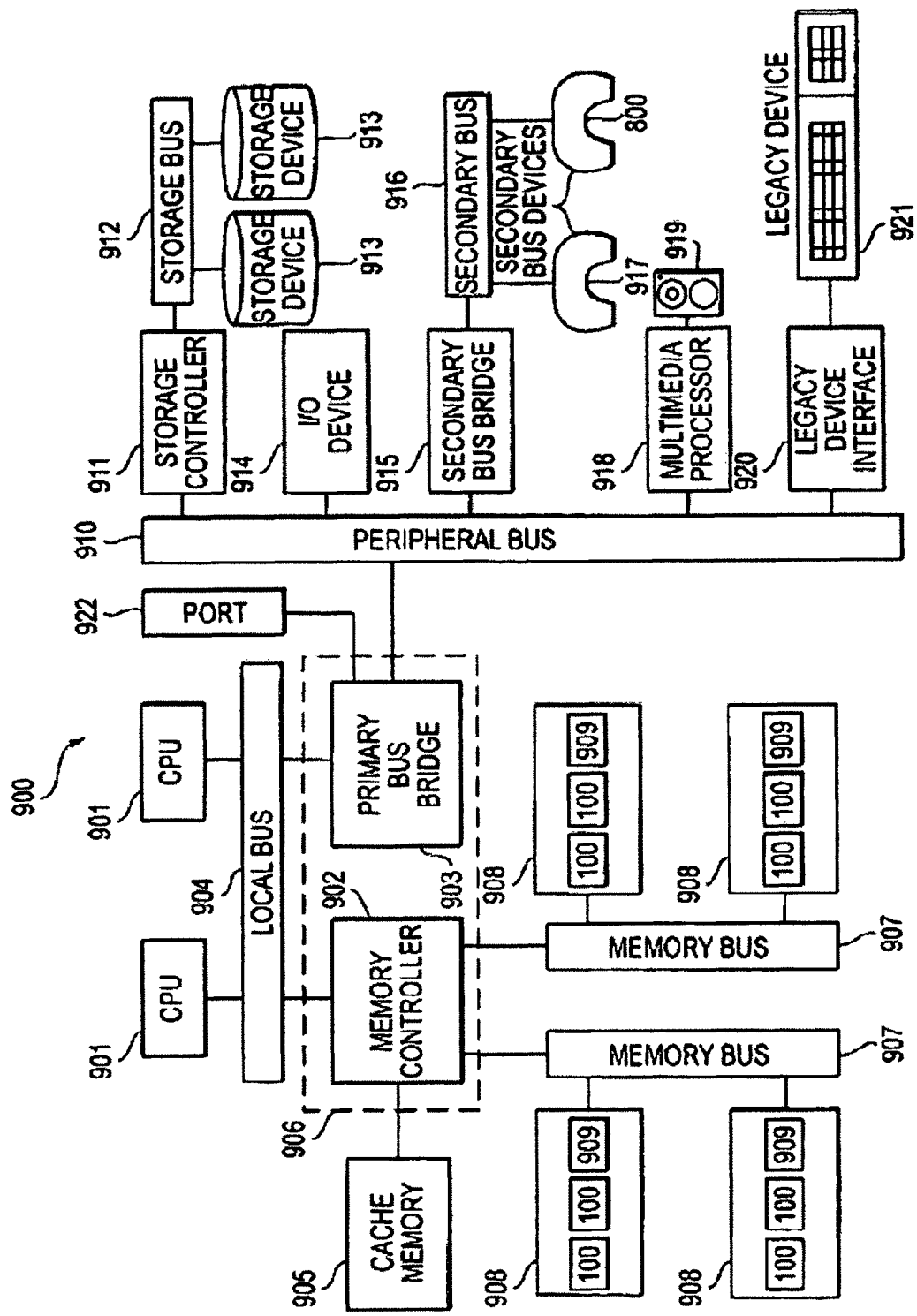
FIG. 9 illustrates a block diagram of a processor system in accordance with an embodiment.

FIG. 9 illustrates a block diagram of a processor system 900 in which embodiments may be employed. In particular, the processor system 900 may utilize the image pick-up device 800, which may be connected to a central processing unit (CPU) 901 or memory devices 100. The processor system 900 including the image pick-up device 800 may be, for example, Computer system/Camera system/Scanner/Machine vision system/Vehicle navigation system/video telephone/surveillance camera/Auto focus system/Star tracker system/Motion detection system/Image stabilization system/Medical imaging device/Data compression system for high-definition television, and so forth.

The processor system 900 may include one or more CPUs 901 coupled to a local bus 904. A memory controller 902 and a primary bus bridge 903 may be coupled the local bus 904. The processor system 900 may include multiple memory controllers 902 and/or multiple primary bus bridges 903. The memory controller 902 and the primary bus bridge 903 may be integrated as a single device 906. The memory controller 902 may also be coupled to one or more memory buses 907.

Each memory bus may accept memory components 908, each of which may include at least one memory device 100. The memory components 908 may be a memory card or a memory module, e.g., single inline memory modules (SIMMs) and dual inline memory modules (DIMMs). The memory components 908 may include one or more additional devices 909, e.g., a configuration memory, such as a serial presence detect (SPD) memory.

The memory controller 902 may also be coupled to a cache memory 905. The cache memory 905 may be the only cache memory in the processing system 900. Alternatively, other devices, e.g., processors 901 may also include cache memories, which may form a cache hierarchy with cache memory 905.

If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 may be coupled to at least one peripheral bus 910. Various devices, such as peripherals or additional bus bridges, may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. For example, when the processor system 900 is in a personal computer, the special purpose port 922 may be an accelerated graphics port (AGP), used to couple a high performance video card to the processor system 900.

The storage controller 911 may couple one or more storage devices 913, via a storage bus 912, to the peripheral bus 910. For example, the storage controller 911 may be a SCSI controller and storage devices 913 may be SCSI discs.

The I/O device 914 may be any sort of peripheral. For example, the I/O device 914 may be a local area network interface, such as an Ethernet card.

The secondary bus bridge 915 may be used to interface additional devices 917 via a secondary bus 916 to the processing system 900. For example, the secondary bus bridge 915 may be an universal serial port (USB) controller used to couple USB devices 917, including the image pick-up device 800 according to embodiments, via to the processing system 900.

The multimedia processor 918 may be a sound card, a video capture card, or any other type of media interface, which may also be coupled to additional devices, e.g., such as speakers 919. The legacy device interface 920 may be used to couple legacy devices, for example, older keyboards and mice, to the processing system 900.

The processing system 900 illustrated in FIG. 15 is only an exemplary processing system with which embodiments may be used. While FIG. 15 illustrates a processing architecture especially suitable for a general purpose computer, such as a personal computer or a workstation, it should be recognized that well known modifications can be made to configure the processing system 900 to become more suitable for use in a variety of applications. For example, electronic devices requiring processing may be implemented using a simpler architecture that relies on a CPU 901, coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders, cellular phones, etc. The modifications may include, for example, elimination of unnecessary components, addition of specialized devices or circuits, and/or integration of a plurality of devices Exemplary embodiments have been disclosed herein, and although specific terms are employed, they are used and are to be interpreted in a generic and descriptive sense only and not for purpose of limitation. For example, the subsampling of embodiments may be implemented in software, e.g., by an article of manufacture having a machine-accessible medium including data that, when accessed by a machine, cause the machine to generate writing strategies in accordance with methods of the present invention. Accordingly, it will be understood by those of ordinary skill in the art that various changes in form and details may be made without departing from the spirit and scope of the present invention as set forth in the following claims.

What is claimed is:

1. A method of k*k subsampling, where k is an integer greater than one, a full frame readout on a plurality of pixels arranged in rows and columns, each pixel belonging to one of at least two sets, a first set configured to sense a first value of an image parameter and a second set configured to sense a second value of the image parameter, the method comprising:
sampling signals of k pixels of at least one of the sets in a first row to output subsampled signals;
converting the subsampled signals into digital signals having a lower resolution than the full frame readout;
repeating sampling and converting for k rows; and
adding digital signals for the first to kth rows within the at least one set, wherein a slope of a ramp signal used during converting is k times a slope of a ramp signal used in digital averaging.

2. The method as claimed in claim 1, wherein, when M is a resolution of the full frame readout, the lower resolution is $[\log_2(2^M/k)]$.

3. The method as claimed in claim 1, further comprising, before converting, reducing noise from sampling.

4. The method as claimed in claim 3, wherein reducing noise includes correlated double sampling.

5. The method as claimed in claim 1, further comprising providing a count reset for converting only once during the subsampling.

6. The method as claimed in claim 1, wherein sampling, repeating, and adding is performed for all rows before converting.

7. The method as claimed in claim 1, wherein converting is performed every k rows.

8. The method as claimed in claim 1, wherein the first and second values correspond to at least two colors.

9. The method as claimed in claim 8, wherein the at two least colors are arranged in a matrix pattern.

10. The method as claimed in claim 1, wherein the at least two sets includes a third set configured to sense a third value of the image parameter, each row including pixels of at least two of the first to third sets.

11. The method as claimed in claim 10, wherein adjacent rows include pixels of the first and second sets and pixels of the first and third sets, repeating includes sampling and converting every other row for the first to kth rows.

12. The method as claimed in claim 1, wherein each row includes pixels of the at least two sets, wherein sampling and converting for first to kth rows is for each set and adding digital signals for the first to kth rows within each set.

13. An apparatus configured to convert analog pixel signals from a plurality of pixels arranged in rows and columns, each pixel belonging to one of at least two sets, a first set configured to sense a first value of an image parameter and a second set configured to sense a second value of the image parameter, into digital signals, the apparatus comprising:
   a sampler configured to sample signals of k pixels for at least one set, where k is an integer greater than one, for a first row;
   an analog to digital converter configured to convert signals output from the first row into a digital signal having a lower resolution than a full frame readout, the sampler and converter configured to sample and convert signals from the first to a kth row; and
   a summation unit configured to sum digital signals for the first to kth rows within the at least one set, wherein a slope of a ramp signal used during converting is k times a slope of a ramp signal used in digital averaging.

14. The apparatus as claimed in claim 13, wherein the at least two sets includes a third set configured to sense a third value of the image parameter, each row including pixels of at least two of the first to third sets.

15. The apparatus as claimed in claim 14, wherein adjacent rows include pixels of the first and second sets and pixels of the first and third sets, the sampler and the analog to digital converter being configured to sample and convert every other row for the first to kth rows.

16. The apparatus as claimed in claim 13, wherein each row includes pixels of the at least two sets, the sampler and the analog to digital converter being configured to sample and convert the first to kth rows for each set and the summation unit being configured to add digital signals for the first to kth rows within each set.

17. The apparatus as claimed in claim 13, further comprising a mode selector configured to determine whether the apparatus is to operate in a first mode or a second mode, when the apparatus is in the first mode, the analog to digital converter is configured to convert signals output from the first row into a digital signal having a resolution equal to that of a full frame readout and the summation unit is inactive, and, when the apparatus is to operate in the second mode, the analog to digital converter is configured to convert signals output from the first row into a digital signal having a lower resolution than a full frame readout, the sampler and converter configured to sample and convert signals from the first to the kth row, and the summation unit is active.

18. The apparatus as claimed in claim 17, wherein the apparatus operates in the first mode when the full frame readout is a still image and in the second mode when the full frame readout is a moving image.

19. An image pick-up device, comprising:
   a plurality of pixels arranged in rows and columns, each pixel belonging to one of at least two sets, a first set configured to sense a first value of an image parameter and a second set configured to sense a second value of the image parameter;
   a sampler configured to sample signals of k pixels for at least one of the sets, where k is an integer greater than one, for a first row;
   an analog to digital converter configured to convert signals output from the first row into a digital signal having a lower resolution than a full frame readout, the sampler and converter configured to sample and convert signals from the first to a kth row; and
   a summation unit configured to sum digital signals for the first to kth rows within the at least one set, wherein a slope of a ramp signal used during converting is k times a slope of a ramp signal used in digital averaging.

20. A system, comprising:
   a processor;
   a memory device in communication with the processor; and
   an image pick-up device in communication with at least one of the processor and the memory device, the image pick-up device including,
      a plurality of pixels arranged in rows and columns, each pixel belonging to one of at least two sets, a first set configured to sense a first value of an image parameter and a second set configured to sense a second value of the image parameter,
      a sampler configured to sample signals of k pixels for at least one of the sets, where k is an integer greater than one, for a first row,
      an analog to digital converter configured to convert signals output from the first row into a digital signal having a lower resolution than a full frame readout, the sampler and converter configured to sample and convert signals from the first to a kth row, and
      a summation unit configured to sum digital signals for the first to kth rows within the at least one set, wherein a slope of a ramp signal used during converting is k times a slope of a ramp signal used in digital averaging.

21. A machine-readable medium that provides executable instructions, which, when executed by a processor, cause the processor to perform a method of k*k subsampling, where k is an integer greater than one, a full frame readout on a plurality of pixels arranged in rows and columns, each pixel belonging to one of at least two sets, a first set configured to sense a first value of an image parameter and a second set configured to sense a second value of the image parameter, the method comprising:

sampling signals of k pixels of at least one of the sets in a first row to output subsampled signals;

converting the subsampled signals into digital signals having a lower resolution than the full frame readout;

repeating sampling and converting for k rows; and adding digital signals for the first to kth rows within the at least one set, wherein a slope of a ramp signal used during converting is k times a slope of a ramp signal used in digital averaging.

* * * * *